(12) United States Patent
Shim et al.

(10) Patent No.: US 8,288,205 B2
(45) Date of Patent: Oct. 16, 2012

(54) PACKAGE IN PACKAGE SYSTEM INCORPORATING AN INTERNAL STIFFENER COMPONENT

(75) Inventors: Seong Bo Shim, Icheon (KR); KyungOe Kim, Icheon (KR); Yong Hee Kang, Icheon (KR)

(73) Assignee: Stats Chippac Ltd., Singapore (SG)

( * ) Notice: Subject to any disclaimer, the term of this patent is extended or adjusted under 35 U.S.C. 154(b) by 411 days.

(21) Appl. No.: 12/051,305

(22) Filed: Mar. 19, 2008

(65) Prior Publication Data

US 2009/0236719 A1    Sep. 24, 2009

(51) Int. Cl.
 *H01L 21/00* (2006.01)
(52) U.S. Cl. ............... 438/109; 438/29; 438/33; 438/34
(58) Field of Classification Search .................... 438/33, 438/34, 109; 257/686
See application file for complete search history.

(56) References Cited

U.S. PATENT DOCUMENTS

| | | | |
|---|---|---|---|
| 6,287,892 B1 | 9/2001 | Takahashi et al. | |
| 6,472,762 B1 | 10/2002 | Kutlu | |
| 6,740,981 B2 | 5/2004 | Hosomi | |
| 7,173,325 B2 | 2/2007 | Vasoya et al. | |
| 7,180,165 B2 | 2/2007 | Ellsberry et al. | |
| 7,196,411 B2 | 3/2007 | Chang | |
| 7,400,032 B2 * | 7/2008 | Corisis et al. | 257/686 |
| 2006/0076671 A1 * | 4/2006 | Kariya et al. | 257/702 |

* cited by examiner

*Primary Examiner* — Kimberly Rizkallah
*Assistant Examiner* — Caleb Henry
(74) *Attorney, Agent, or Firm* — Ishimaru & Associates LLP; Mikio Ishimaru; Stanley M. Chang

(57) ABSTRACT

The present invention is a method of manufacture of a package-in-package system, comprising: providing a bottom internal stacking module incorporating a semiconductor die and a package substrate, attaching an internal stiffening module, with a die receptacle, on the bottom internal stacking module, and attaching a top internal stacking module incorporating a further semiconductor die and a further package substrate upside-down on the internal stiffening module.

20 Claims, 5 Drawing Sheets

PACKAGE IN PACKAGE SYSTEM INCORPORATING AN INTERNAL STIFFENER COMPONENT

TECHNICAL FIELD

The present invention relates generally to semiconductor packaging technology and more particularly, to a package in package system incorporating an internal stiffener for improving multi-package module yield and reliability.

BACKGROUND ART

System requirements for consumer electronics such as cell phones and laptop computers have resulted in the implementation of integrated circuit packages incorporating several semiconductor dies or "chips". Such multi-chip packages may be realized by connecting multiple semiconductor dies on a single package substrate incorporating interconnects. In this approach, the semiconductor dies are distributed over the surface of the package or stacked on top of each other.

Alternatively, the Package-in-Package (PiP) approach for packaging multi-chip modules involves first mounting a semiconductor die on a package substrate with interconnects, forming an Internal Stacking Module (ISM). This package module can be tested individually prior to assembly into a multi-chip package. Thus the PiP approach provides a means of pre-testing package sub-assemblies (i.e., internal stacking modules), enabling the assembly of complex multi-chip packages using "known good packages." This modular approach for assembling multi-chip packages reduces overall yield loss.

One important reason for PiP yield loss is warping of internal stacking modules during the PiP assembly process. Cooling and heating cycles encountered in the package fabrication process can induce bending of internal stacking modules due to package asymmetries (both geometry and materials asymmetries). In addition, bending of package substrates used for the ISMs can induce stress concentrations at the corners of the semiconductor die, inducing chip failures. Moreover, a third reason for yield loss is inter-ISM interconnect failures due induced by stress created by temperature cycles encountered in the fabrication process for the package.

Thus, a need still remains for a system for a package-in-package system that can tolerate thermal cycles used for the fabrication process with minimal yield loss. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention is a method of manufacture of a package-in-package system, comprising: providing a bottom internal stacking module incorporating a semiconductor die and a package substrate, attaching an internal stiffening module with a die receptacle on the bottom internal stacking module, and attaching a top internal stacking module incorporating a further semiconductor die and a further package substrate upside-down on the internal stiffening module.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
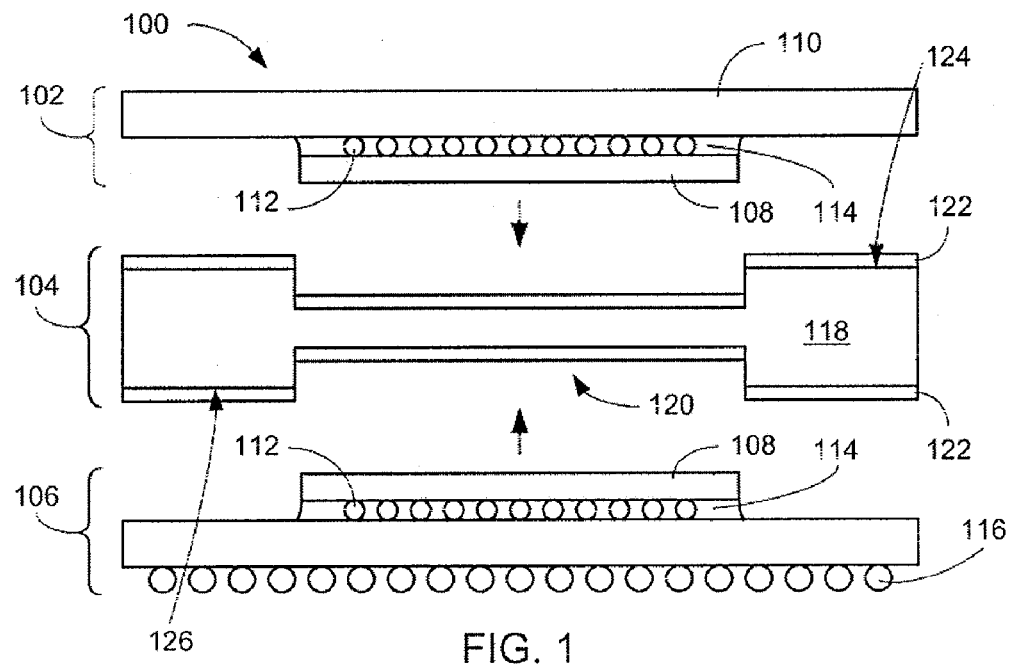
FIG. 1 is an exploded cross-sectional view of a package-in-package system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown exaggerated in the drawing FIGs. In addition, where multiple embodiments are disclosed and described having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the semiconductor die, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements. The term "system" as used herein refers to and is defined as the method and as the apparatus of the present invention in accordance with the context in which the term is used."

Referring now to FIG. 1, therein is shown an exploded cross-sectional view of a package-in-package system 100 in an embodiment of the present invention. The package-in-package system 100 is assembled using three main modules: a top internal stacking module 102, an internal stiffening module 104, and a bottom internal stacking module 106.

The term "top internal stacking module" as used herein is defined as a package-in-package sub-assembly incorporating a semiconductor die 108 mounted on a package substrate 110 at the top position of the package-in-package system 100. Similarly, the term "bottom internal stacking module" as used herein is defined as a package-in-package sub-assembly incorporating the semiconductor die 108 mounted on the package substrate 110 at the bottom position of the package-in-package system 100. The internal stiffening module 104 can be attached on the bottom internal stacking module 106. The top internal stacking module 102 can be attached upside-down on the internal stiffening module 104. The upside-down configuration refers to the semiconductor die 108 and the package substrate 110 both of bottom internal stacking module 106 mirrored by the semiconductor die 108 and the package substrate 110 both of the top internal stacking module 102.

In the preferred embodiment of the invention, both the top internal stacking module 102 and the bottom internal stacking module 106 incorporate the semiconductor die 108 mounted on the package substrate 110 in a flip-chip configuration using a solder ball 112 to provide electrical connectivity between the semiconductor die 108 and the package substrate 110. An underfill material 114 placed between the semiconductor die 108 and the package substrate 110 provides mechanical support and helps relieve mechanical stress induced by the solder ball 112.

The term "internal stiffening module" as used herein is defined as a multilayered structure incorporating a rigid substrate 118 with a die receptacle 120 and a thermal interface material 122. The rigid substrate 118 can have a rigid substrate top side 124 and a rigid substrate bottom side 126 facing away from the rigid substrate top side 124. The internal stiffening module 104 provides mechanical rigidity, stress relief, and resistance to mechanical stresses induced by thermal cycles encountered during the fabrication process for the package-in-package system 100. The thermal interface material 122 is on the rigid substrate bottom side 126 and the rigid substrate top side 124. The internal stiffening module 104 is attached to the bottom internal stacking module 106 with the thermal interface material 122 on or directly on the semiconductor die 108 of the bottom internal stacking module 106. The top internal stacking module 102 is attached to the internal stiffening module 104 with the semiconductor die 108 of the top internal stacking module 102 on or directly on the thermal interface material 122 of the rigid substrate ton side 124.

The core element of the internal stiffening module 104 is the rigid substrate 118 with the die receptacle 120 defined at the rigid substrate top side 124 and the rigid substrate bottom side 126. The die receptacle 120 is configured to accept the semiconductor die 108 mounted on the package substrate 110 while minimizing the overall thickness of the package-in-package system 100. The die receptacle 120 at the rigid substrate top side 124 can accept the semiconductor die 108 of the ton internal stacking module 102. The die receptacle 120 at the rigid substrate bottom side 126 can accept the semiconductor die 108 of the bottom internal stacking module 106. The thermal interface material 122 provides stress relief between the top internal stacking module 102 and the internal stiffening module 104, and between the bottom internal stacking module and the internal stiffening volume. In one embodiment of the invention the thermal interface material 122 is a deformable material. The term "deformable material" as used herein is defined as a material that alters its shape by stress.

The rigid substrate 118 used for the internal stiffening module 104 is composed of a material optimized in terms of stiffness, compressive strength, brittleness, and coefficient of thermal expansion. In one embodiment of the invention the rigid substrate 118 is made of a thermally conducting material such as copper.

In the preferred embodiment of the invention, the thermal interface material 122 is a material that is capable of softening as it is heated, and then hardening again when it is cooled, thus providing stress relief during the heat cycles encountered in the fabrication process for the package-in-package system 100. In one embodiment of the invention, a thermoplastic is used as the thermal interface material 122. Other options include a low melting point metal, hybrid materials such as silicones containing a thermally conductive material, and epoxies.

Figure 2:
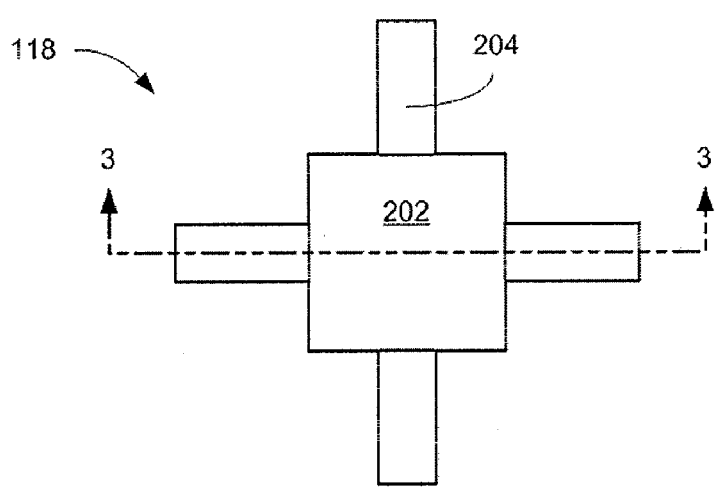
FIG. 2 is a top view of the rigid substrate component of the internal stiffening module.

Referring now to FIG. 2, therein is shown a top view of the rigid substrate 118 component of the internal stiffening module 104. The rigid substrate 118 is a single component with a central portion 202 and an extension 204. The top view depicts the central portion 202 having a square geometric shape. The central portion 202 can have one or more of the extension 204 along a perimeter of the central portion 202. The extension 204 is thicker than the central portion 202.

Figure 3:
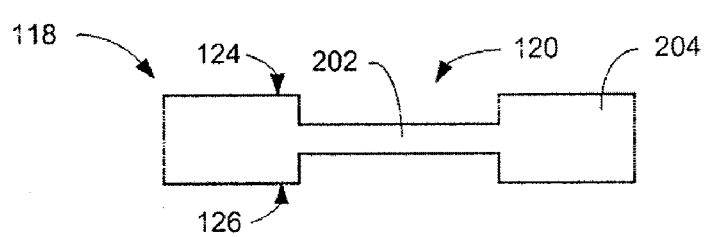
FIG. 3 is a cross-section of the rigid substrate 118 along line 3-3 shown in FIG. 2.

Referring now to FIG. 3, therein is shown a cross-section of the rigid substrate 118 along line 3-3 shown in FIG. 2. The die receptacle 120 is located at the central portion 202 of the rigid substrate 118 and is bounded by the extension 204. The die receptacle 120 does not traverse between the rigid substrate top side 124 and the rigid substrate bottom side 126. The rigid substrate 118 can have the rigid substrate too side 124 and the rigid substrate bottom side 126.

Figure 4:
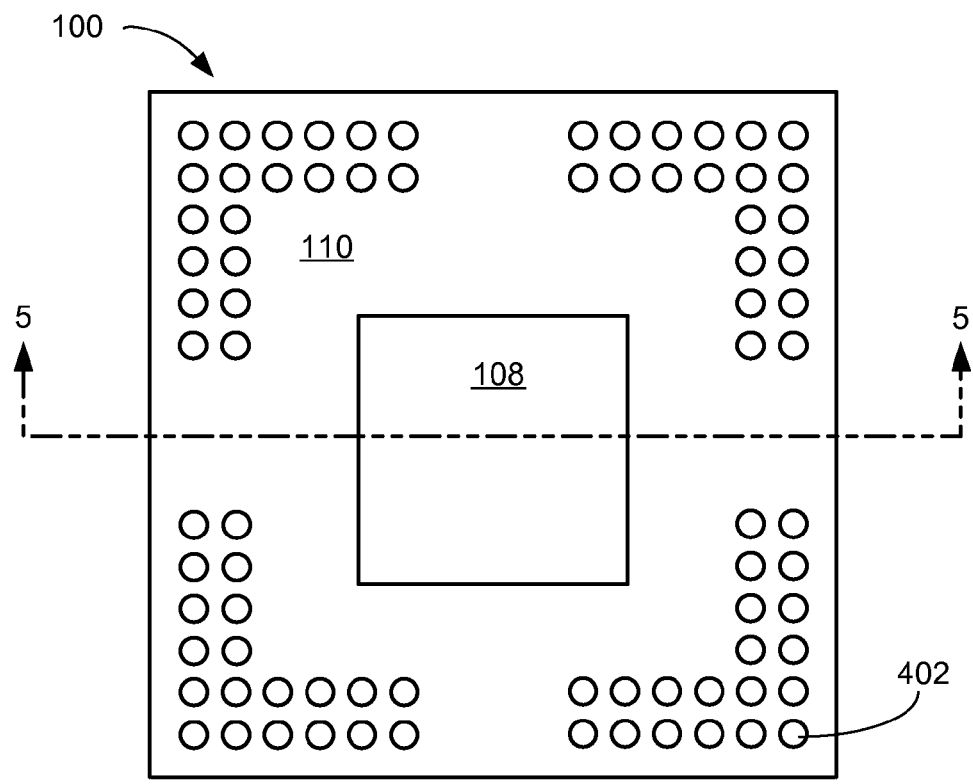
FIG. 4 is a top view of the bottom internal stacking module at the initial stages of the fabrication process for the package-in-package system.

Referring now to FIG. 4, therein is shown a top view of the package-in-package system 100 in the initial stages of fabrication according to an embodiment of the present invention. The bottom internal stacking module 106 is provided as the initial stage in the fabrication process. The fabrication process results in the formation of the package-in-package system 100 shown in FIG. 1. The bottom internal stacking module 106 includes the semiconductor die 108 mounted on the package substrate 110. A contact pad 402 is placed in the periphery of the package substrate. The contact pad 402 is an electrical terminal that provides electrical connectivity between the semiconductor die 108 in the bottom internal stacking module 106 and other parts of the package-in-package system 100 shown in FIG. 1.

Figure 5:
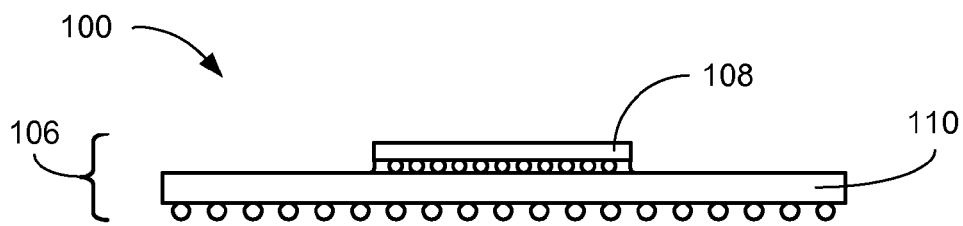
FIG. 5 is a cross-section of the bottom internal stacking module 106 along line 5-5 shown in FIG. 4.

Referring now to FIG. 5, therein is shown a cross-section of the bottom internal stacking module 106 along line 5-5 shown in FIG. 4. As described in FIG. 1 and in FIG. 4, the bottom internal stacking module 106 includes the semiconductor die 108 mounted on the package substrate 110.

Figure 6:
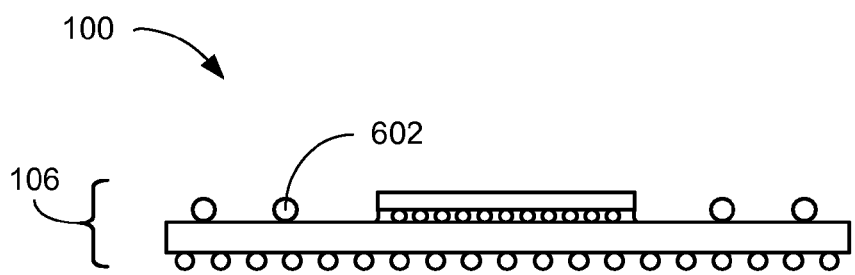
FIG. 6 is a side view of the package-in-package system 100 in the initial stages of fabrication according to an embodiment of the present invention.

Referring now to FIG. 6, therein is shown a side view of the package-in-package system 100 in the initial stages of fabrication according to an embodiment of the present invention. At this stage of the fabrication process, the bottom internal stacking module 106 is provided. A solder ball 602 placed on the contact pad 402 of FIG. 4, is visible from the orientation show in the FIG. 6 but is not visible in the cross-section shown in FIG. 5.

Figure 7:
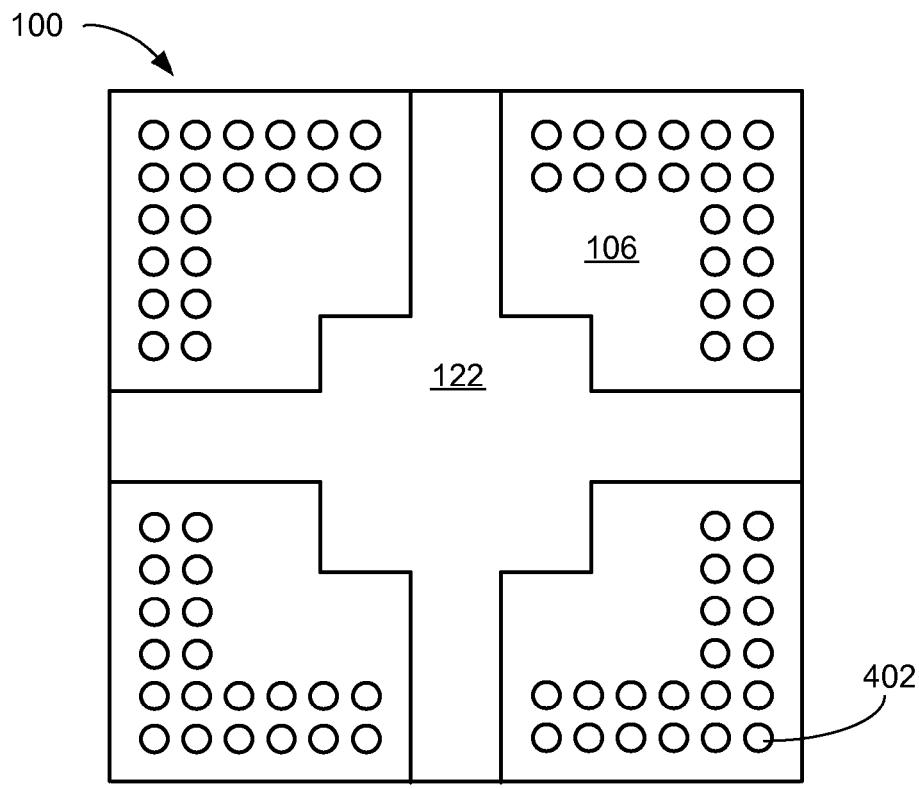
FIG. 7 is a top view of the structure shown in FIG. 4 following the deposition of the thermal interface material.

Referring now to FIG. 7, therein is shown a top view of the structure shown in FIG. 4 following the deposition of the thermal interface material 122. The thermal interface material 122 covers portions of the bottom internal stacking module 106, leaving the contact pad 402 exposed. In an alternative embodiment of the invention, the internal stiffening module 104 shown in FIG. 1 is preformed and placed directly over the bottom internal stacking module 106.

Figure 8:
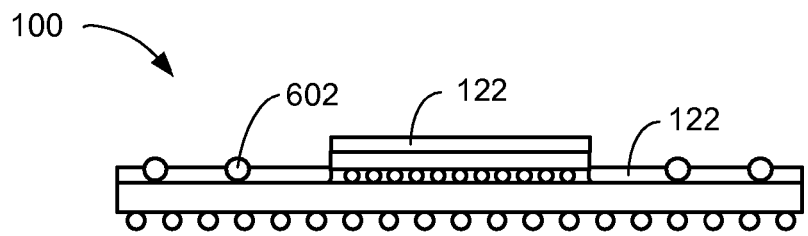
FIG. 8 is the structure of FIG. 6 following the deposition of the thermal interface material.

Referring now to FIG. 8, therein is shown the structure of FIG. 6 following the deposition of the thermal interface material 122. The thermal interface material 122 does not cover the solder ball 602.

Figure 9:
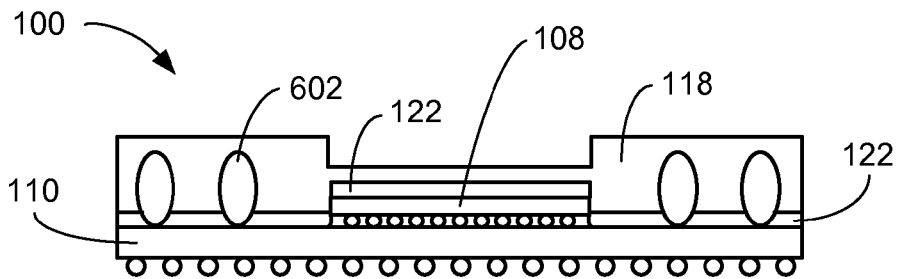
FIG. 9 is the structure of FIG. 8 following the attachment of the rigid substrate.

Referring now to FIG. 9, therein is shown the structure of FIG. 8 following the attachment of the rigid substrate 118. The solder ball 602 is deformed as a result of the thermal cycle used for the attachment process. The thermal interface material 122 provides adhesion between the rigid substrate 118 and portions of the package substrate 110 and between the rigid substrate 118 and the semiconductor die 108.

Figure 10:
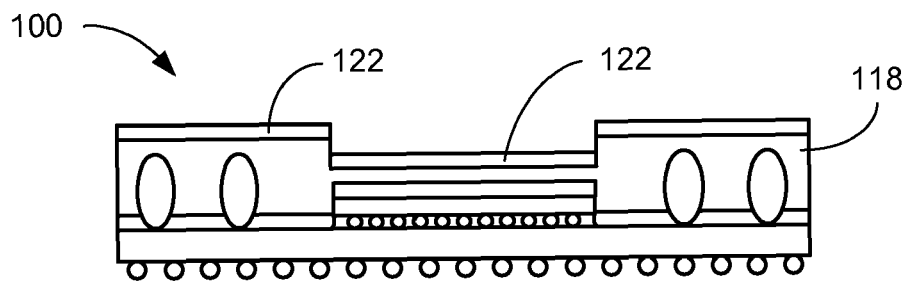
FIG. 10 is the structure of FIG. 9 following the deposition of a top thermal interface material.

Referring now to FIG. 10, therein is shown the structure of FIG. 9 following the deposition of a second layer of the thermal interface material 122. The top surface of the rigid substrate 118 is completely covered by the thermal interface material 122.

Figure 11:
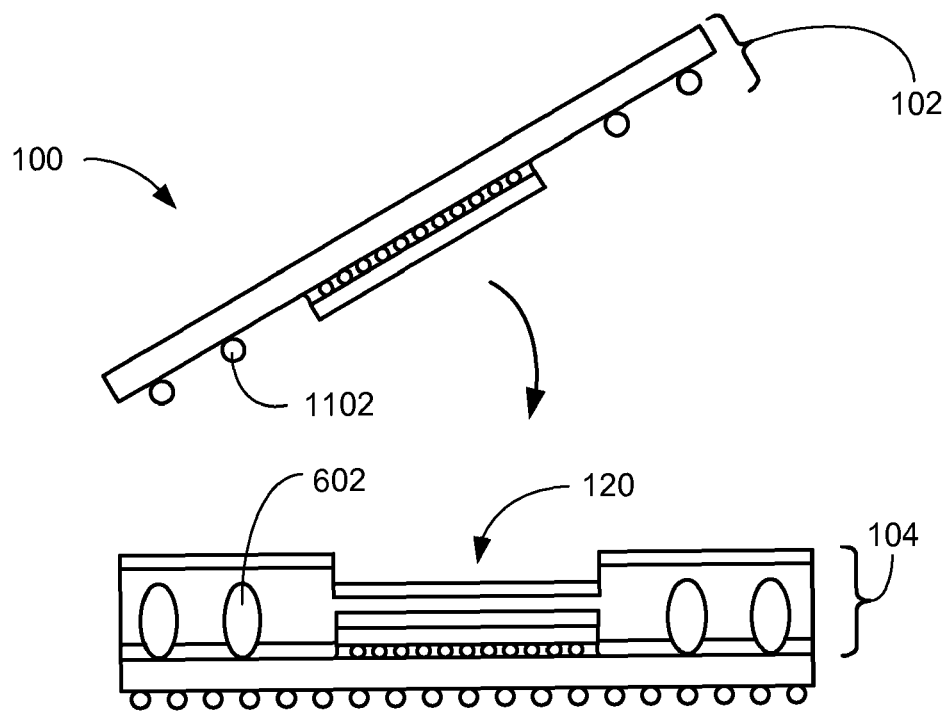
FIG. 11 is the structure of FIG. 10 during the reverse stacking of the top internal stacking module.

Referring now to FIG. 11, therein is shown the structure of FIG. 10 during the reverse stacking of the top internal stacking module 102. During this step, the top internal stacking module 102 is turned upside down and is self-aligned by the die receptacle 120 in the internal stiffening module 104. The top internal stacking module 102 already has a top solder ball 1102 attached to it prior to the reverse-stacking step.

Figure 12:
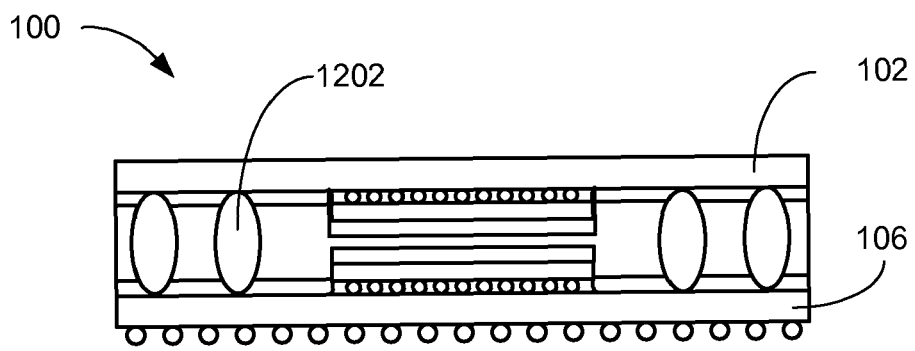
FIG. 12 the structure of FIG. 11 following the attachment of the top internal stacking module.

Referring now to FIG. 12, therein is shown the structure of FIG. 11 following the attachment of the top internal stacking module 102. The solder ball 602 and the top solder ball 1202 shown in FIG. 11 come into contact during the heat cycle in the attachment step, forming an electrical connection 1202 between the bottom internal stacking module 106 and the top internal stacking module 102.

Figure 13:
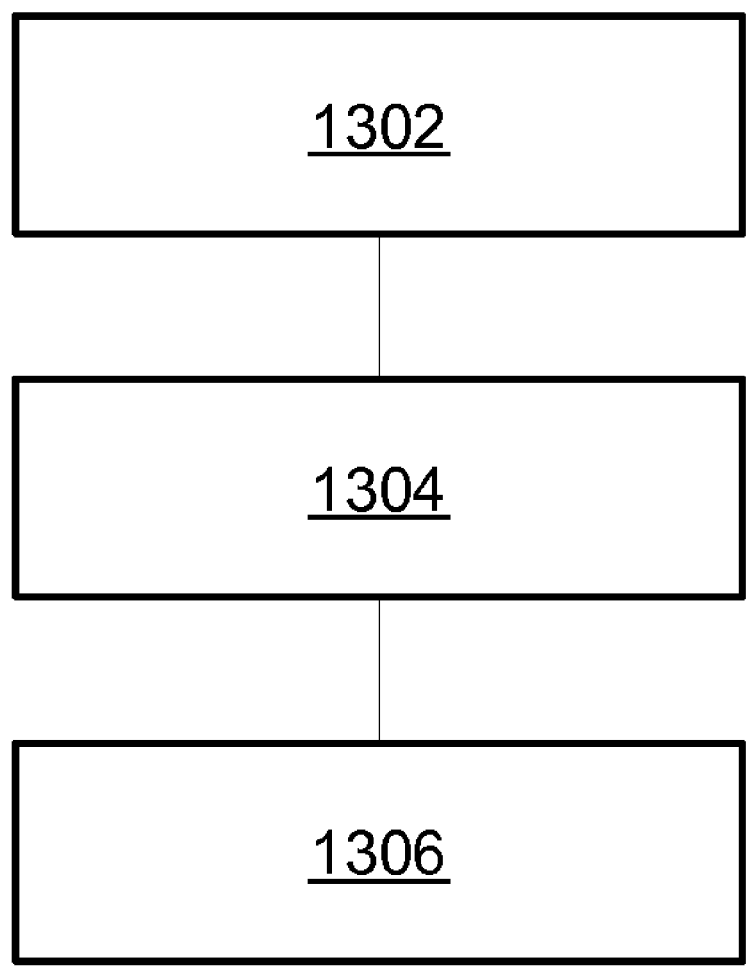
FIG. 13 is a flow chart of a package-in-package system for manufacturing the package-in-package system incorporating the internal stiffening module.

Referring now to FIG. 13, therein is shown a flow chart of a package-in-package system 1300 for manufacturing the package-in-package system 100 incorporating the internal stiffening module 104.

The package-in-package system 1300 for manufacturing the package-in-package system 100 includes providing a bottom internal stacking module incorporating a semiconductor die and a package substrate in a block 1302; attaching an internal stiffening module with a die receptacle on the bottom internal stacking module in a block 1304; and, attaching a top internal stacking module incorporating a further semiconductor die and a further package substrate upside-down on the internal stiffening module in a block 1306.

A principal aspect that has been unexpectedly discovered is that the present invention is that the package-in-package system provides a means for implementing multi-chip packages with much lower yield loss after fabrication. The material composition and design of the internal stiffening module reduces thermal stress-induced delamination of package components and stress-induce cracking of the corners of the semiconductor die 108 used in the internal stacking modules.

Another aspect is that the invention provides self-alignment of components in a multi-chip module, enabling greater interconnect density between internal stacking modules.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the package system of the present invention furnishes important and heretofore unknown and unavailable solutions, capabilities, and functional aspects for providing electromagnetic interference shielding for semiconductor packages. The resulting processes and configurations are straightforward, cost-effective, uncomplicated, highly versatile and effective, can be surprisingly and unobviously implemented by adapting known technologies, and are thus readily suited for efficiently and economically manufacturing semiconductor packages fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacturing a package-in-package system, comprising:
providing a bottom internal stacking module incorporating a semiconductor die and a package substrate;
attaching an internal stiffening module, with a die receptacle, directly on the semiconductor die of the bottom internal stacking module, the internal stiffening module includes thermally conductive material; and
attaching a top internal stacking module, incorporating a further semiconductor die and a further package substrate upside-down on the internal stiffening module.

2. The method as claimed in claim 1 wherein:
providing the bottom internal stacking module includes mounting the semiconductor die on the package substrate; and
attaching the internal stiffening module includes attaching a rigid substrate having the die receptacle with the die receptacle accepting the semiconductor die of the bottom internal stacking module.

3. The method as claimed in claim 1 wherein attaching the internal stiffening module includes attaching a rigid substrate, with a central portion having an extension along a perimeter of the central portion, and the die receptacle located at the central portion and bounded by the extension.

4. The method as claimed in claim 1 wherein:
attaching the internal stiffening module on the bottom internal stacking module provides self-alignment between the bottom internal stacking module and the internal stiffening module; and
attaching the top internal stacking module upside-down on the internal stiffening module provides self-alignment between the internal stiffening module and the top internal stacking module.

5. The method as claimed in claim 1 wherein:
providing the bottom internal stacking module includes mounting the semiconductor die on the package substrate;
attaching the internal stiffening module includes attaching a rigid substrate having the die receptacle at a rigid substrate bottom side and a further die receptacle at a rigid substrate top side with the die receptacle accepting the semiconductor die; and
attaching the top internal stacking module includes attaching the top internal stacking module upside-down on the internal stiffening module with the further die receptacle accepting the further semiconductor die.

6. A method of manufacturing a package-in-package system, comprising:
providing a bottom internal stacking module incorporating a semiconductor die and a package substrate with a contact pad;
depositing a thermal interface material directly on the semiconductor die of the bottom internal stacking module;
attaching a rigid substrate on the thermal interface material, the rigid substrate is a thermally conductive material;
depositing the thermal interface material directly on portions of the rigid substrate; and
attaching a top internal stacking module, incorporating a further semiconductor die and a further package substrate upside-down on an internal stiffening module.

7. The method as claimed in claim 6 wherein attaching the rigid substrate includes attaching the rigid substrate having a rigid substrate top side and a rigid substrate bottom side, and a die receptacle not traversing between the rigid substrate bottom side and the rigid substrate top side.

8. The method as claimed in claim 6 further comprising dispensing a solder ball on the contact pad of the bottom internal stacking module.

9. The method as claimed in claim 6 further comprising compressing and heating the package-in-package system.

10. The system as claimed in 6 wherein attaching the rigid substrate includes attaching the rigid substrate having a central portion, the central portion having a square geometric shape.

11. A package-in-package system, comprising:
a bottom internal stacking module incorporating a semiconductor die and a package substrate;
an internal stiffening module, with a die receptacle, attached directly on the semiconductor die of the bottom internal stacking module, the internal stiffening module includes thermally conductive material; and
a top internal stacking module, incorporating a further semiconductor die and a further package substrate attached upside-down directly on the internal stiffening module.

12. The system as claimed in claim 11 wherein:
the internal stiffening module includes a rigid substrate having the die receptacle accepting the semiconductor die of the bottom internal stacking module.

13. The system as claimed in claim 11 wherein the die receptacle of the internal stiffening module is an alignment and registration element for aligning the internal stiffening module to the bottom internal stacking module or the top internal stacking module.

14. The system as claimed in claim 11 wherein:
the internal stiffening module includes a rigid substrate having a rigid substrate bottom side and a rigid substrate top side;
the die receptacle is at the rigid substrate bottom side and accepts the semiconductor die of the bottom internal stacking module; and
a further die receptacle is at the rigid substrate top side and accepts the further semiconductor die of the top internal stacking module.

15. The system as claimed in claim 11 wherein:
the package substrate of the bottom internal stacking module includes a contact pad;
the internal stiffening module incorporates a rigid substrate having the die receptacle; and
further comprising:
a thermal interface material directly on portions of the rigid substrate.

16. The system as claimed in claim 15 further comprising a solder ball that provides a connection between the bottom internal stacking module and the top internal stacking module.

17. The system as claimed in claim 15 wherein the thermal interface material is a thermoplastic.

18. The system as claimed in claim 15 wherein:
the rigid substrate includes a rigid substrate bottom side and a rigid substrate top side; and
the die receptacle does not traverse between the rigid substrate bottom side and the rigid substrate top side.

19. The system as claimed in claim 15 wherein the rigid substrate includes a central portion having a square geometric shape.

20. The system as claimed in claim 11 wherein the internal stiffening module includes a rigid substrate further includes:
a central portion having an extension along a perimeter of the central portion; and
the die receptacle located at the central portion of the rigid substrate and bounded by the extension.

* * * * *

UNITED STATES PATENT AND TRADEMARK OFFICE
CERTIFICATE OF CORRECTION

| | | |
|---|---|---|
| PATENT NO. | : 8,288,205 B2 | Page 1 of 1 |
| APPLICATION NO. | : 12/051305 | |
| DATED | : October 16, 2012 | |
| INVENTOR(S) | : Shim et al. | |

It is certified that error appears in the above-identified patent and that said Letters Patent is hereby corrected as shown below:

In the Specification:

Column 3, line 64, delete "the rigid substrate ton side" and insert therefor
-- the rigid substrate top side --

Column 4, line 7, delete "the ton internal stacking module 102." and insert therefor
-- the top internal stacking module 102. --

Column 4, line 49, delete "the rigid substrate too side" and insert therefor
-- the rigid substrate top side --

Signed and Sealed this
Twenty-eighth Day of April, 2015

Michelle K. Lee
*Director of the United States Patent and Trademark Office*